(12) United States Patent
Ouchi

(10) Patent No.: US 6,928,205 B2
(45) Date of Patent: Aug. 9, 2005

(54) OPTICAL WAVEGUIDE DEVICE, LAYERED SUBSTRATE AND ELECTRONICS USING THE SAME

(75) Inventor: Toshihiko Ouchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/730,033

(22) Filed: Dec. 9, 2003

(65) Prior Publication Data

US 2004/0114854 A1 Jun. 17, 2004

Related U.S. Application Data

(63) Continuation of application No. PCT/JP03/09727, filed on Jul. 31, 2003.

(30) Foreign Application Priority Data

Aug. 2, 2002 (JP) ..................................... 2002-225467

(51) Int. Cl.[7] ............................................... G02B 6/12
(52) U.S. Cl. ............................ 385/14; 385/47; 385/89; 385/129
(58) Field of Search ............................... 385/14, 31–36, 385/88, 89, 129, 130, 47

(56) References Cited

U.S. PATENT DOCUMENTS

| | | | |
|---|---|---|---|
| 4,447,118 A | 5/1984 | Mulkey | 350/96.16 |
| 5,191,219 A | 3/1993 | Linke | 250/551 |
| 5,500,912 A | 3/1996 | Alonas et al. | 358/37 |
| 5,712,504 A | 1/1998 | Yano et al. | 257/452 |
| 5,822,475 A * | 10/1998 | Hirota et al. | 385/24 |
| 5,835,646 A | 11/1998 | Yoshimura et al. | 385/14 |
| 5,978,526 A | 11/1999 | Morikuni et al. | 358/14 |
| 6,097,472 A | 8/2000 | Tanaka et al. | 355/47 |
| 6,321,001 B1 * | 11/2001 | Heflinger | 385/24 |
| 6,343,171 B1 | 1/2002 | Yoshimura et al. | 385/50 |
| 6,366,375 B1 | 4/2002 | Sakai et al. | 359/115 |
| 6,396,968 B2 * | 5/2002 | Pillkahn | 385/14 |
| 6,499,899 B2 | 12/2002 | Sawyer | 385/88 |
| 6,505,409 B2 | 1/2003 | Toda et al. | 33/366.24 |
| 6,509,645 B2 | 1/2003 | Tatsumi et al. | 257/738 |
| 6,516,104 B1 | 2/2003 | Furuyama | 385/14 |
| 6,563,137 B2 | 5/2003 | Uchida | 257/84 |
| 6,603,915 B2 * | 8/2003 | Glebov et al. | 385/129 |
| 6,611,000 B2 | 8/2003 | Tamura et al. | 257/80 |
| 6,678,439 B2 * | 1/2004 | Hoffmann et al. | 385/24 |
| 2002/0109074 A1 | 8/2002 | Uchida | 250/214.1 |
| 2002/0132462 A1 | 9/2002 | Tatsumi et al. | 438/613 |
| 2002/0167013 A1 | 11/2002 | Iwasaki et al. | 257/79 |
| 2002/0196502 A1 | 12/2002 | Perner | 359/154 |
| 2003/0020164 A1 | 1/2003 | Tatsumi et al. | 257/737 |
| 2003/0039455 A1 | 2/2003 | Ouchi | 385/88 |
| 2003/0179979 A1 | 9/2003 | Ouchi | 385/14 |
| 2004/0061224 A2 | 4/2004 | Tatsumi et al. | 257/737 |

FOREIGN PATENT DOCUMENTS

| | | |
|---|---|---|
| EP | 0 322 218 A2 | 6/1989 |
| EP | 0 672 924 A1 | 9/1995 |
| EP | 0 864 894 A1 | 9/1998 |

(Continued)

OTHER PUBLICATIONS

L Balliet et al., "Optical Transmission System for Interconnecting Electronic Units", 26(4) *IBM Technical Disclosure Bulletin* 1793–1796 (1983).

(Continued)

*Primary Examiner*—Juliana K. Kang
(74) *Attorney, Agent, or Firm*—Fitzpatrick, Cella, Harper & Scinto

(57) ABSTRACT

An optical waveguide device that comprises an optical waveguide layer and a light-receiving element, wherein the optical waveguide layer is provided with a light direction-altering means for altering the direction of light propagated in the optical waveguide layer and directing the light to the light-receiving element, and the light-receiving element is provided with a plurality of light-receiving portions, each of the light-receiving portions being capable of receiving signals independently.

15 Claims, 7 Drawing Sheets

FOREIGN PATENT DOCUMENTS

| | | |
|---|---|---|
| JP | 59-75656 | 4/1984 |
| JP | 61-28240 | 2/1986 |
| JP | 2-5639 | 1/1990 |
| JP | 5-181026 | 7/1993 |
| JP | 8-220357 | 8/1996 |
| JP | 9-96746 | 4/1997 |
| JP | 9-270751 | 10/1997 |
| JP | 10-206677 | 8/1998 |
| JP | 10-294254 | 11/1998 |
| JP | 11-54406 | 2/1999 |
| JP | 11-72750 | 3/1999 |
| JP | 11-111609 | 4/1999 |
| JP | 11-196069 | 7/1999 |
| JP | 2000-31189 | 1/2000 |
| JP | 2000-31190 | 1/2000 |
| JP | 2000-235127 | 8/2000 |
| JP | 2000-337872 | 12/2000 |
| JP | 2001-284635 | 10/2001 |

OTHER PUBLICATIONS

Steven C. Binari et al., "GaN FETs for Microwave and High–temperatureApplications," 41(2) *Solid–State Electronics* 177–80 (1997).

Seikoh Yoshida et al., "High–temperature Reliability of GaN Metal Semiconductor Field–Effect Transistor and Bipolar Junction Transistor," 85(11) *J. Appl. Phys.* 7931–34 (Jun. 1999).

* cited by examiner

OPTICAL WAVEGUIDE DEVICE, LAYERED SUBSTRATE AND ELECTRONICS USING THE SAME

This application is a continuation of International Application No. PCT/JP03/09727, filed on Jul. 31, 2003, which claims the benefit of Japanese Patent Application No. 225467/2002, filed on Aug. 2, 2002.

BACKGROUND OF THE INVENTION

1. Field of the Invention

The present invention relates to an optical waveguide device having an optical waveguide such as optical waveguide layer for optically coupling signals between electronic chips on an electric circuit board or between electric circuit boards, for example. The present invention also relates to a layered substrate made up of such a device integrated with an electric circuit board, and an electronic equipment using the same.

2. Related Background Art

In recent years, there has been rapid progress in performance of portable devices such as personal computers, cellular phones and personal digital assistants (PDA), and digital audio/video (AV) apparatuses. These devices are interconnected at any frequency band using a combination of wireless and wired connections. There is, therefore, an urgent need to address any faulty operation of digital devices due to, for example, electromagnetic interference (EMI) from circuit boards, interference by external electromagnetic radiation, and signal integrity (SI) disturbance by faulty connections. These problems associated with electromagnetic waves require the products to satisfy the regulatory standards imposed by the Radio Law before shipment, and the developing costs to fulfill the requirement is increasing year by year. It is expected that the optical wiring, which inherently induces no electromagnetic radiation, may essentially eliminate the bottleneck. With the prospect that a high-speed connection environment such as FTTH will be available even at home in the future, faulty operation, noise disturbance and the like of high-speed electronics must be avoided taking into account the fact they may be connected to different types of ground environment. The optical connection is one potential solution, because it provides electrical isolation from the ground in a simple manner.

To this end, a variety of ways have been proposed for optical wiring means. Among them, a method of using an optical waveguide sheet to make a bus connection among a plurality of electric circuit boards in an information processing apparatus 1100 has been disclosed in Japanese Patent Application Laid-open Nos. 09-270751 and 10-206677. In those disclosures, an optical waveguide sheet 1101 and electric circuit boards 1120 are coupled together independently and vertically, as shown in FIG. 8A. Optical elements 1132, 1142 are mounted at input and output ports 1130, 1140 on an electric circuit board 1120, and are adapted to couple with the optical waveguide sheet 1101 via mirrors 1133s inclined at an angle of 45 degrees. In this example, the optical waveguide sheet 1101 constitutes a planar slab waveguide and multiplexes signals in a direction along the layers. In FIG. 8B, reference numeral 1123 denotes an electronic circuit, 1131 and 1141 denote circuits for optical elements, 1133 denotes an input for signal light, and 1134 denotes an output for signal light.

Although an optical waveguide sheet as shown in FIGS. 8A and 8B leads to cost savings, because it mitigates the problems of fabrication and alignment, it requires one sheet for each bit of a bus. This limits its application, because a parallel-to-serial conversion and/or multilayer sheet is required to accommodate a multi-bit bus. Although several systems to multiplex multi-bit signals using one single sheet have been studied, they resulted in a complex system, because signals are separated according to the signal strength or wavelength.

SUMMARY OF THE INVENTION

An optical waveguide device according to the present invention comprises an optical waveguide layer and a light-receiving element, wherein the optical waveguide layer is provided with a light direction-altering means for altering the direction of light propagated in the optical waveguide layer and for directing the light to the light-receiving element, and the light-receiving element is provided with a plurality of light-receiving portions, each of the light-receiving portions being capable of receiving signals independently. According to one embodiment of the present invention, the waveguide device comprises an optical waveguide layer being a planar slab waveguide for propagating light to exchange signals using light, wherein the optical waveguide layer is provided with a light-receiving element and a light direction-altering means to direct the light to the light-receiving element at a certain angle to the optical waveguide surface (for example, a direction perpendicular to the plane of the optical waveguide layer) of the optical waveguide layer, and the light-receiving element is composed of an array of light-receiving portions, which are operable independently, where the light direction-altering means and the light-receiving element are positioned in such a manner that the light propagated through the optical waveguide sheet and redirected by the light direction-altering means is received by the light-receiving portions of the light-receiving element. According to this configuration, the signal processing part can receive signals discriminating the light-transmitting sources, because the distribution of light intensity received at the light-receiving portions of the light-receiving element varies depending on the location of the light-transmitting sources, which realizes a multiplexed optical wiring of unrestricted wiring-architecture without using a complex waveguide structure.

The layered substrate according to the present invention is characterized in that an optical waveguide device described above is mounted on an electric circuit board (as well as to an electronic chip), so that electric connections can be formed, whereby all or a part of the signals from the electric circuit are interconnected by exchanging optical signals through the optical waveguide device to drive electronics. More specifically, at least one optical waveguide device and one electric circuit board may be layered and through-hole vias formed in all or a part of the layered optical waveguide devices to connect electric wirings to the electric circuit board in order to drive optical elements of each optical waveguide device. The optical waveguide device may be embedded within an electric circuit multilayer substrate, or the waveguide devices themselves may be multilayered and connected to an electric circuit board and electronic chips.

The electronic device according to the present invention uses the layered substrate described above, and the system is operated with optical wirings mixed with multi-bit wirings between electronic chips such as CPUs and memory devices.

Thus, by layering an optical waveguide device to an electric circuit board to replace a part of the wirings of an electric board provided with LSI etc. with an optical wiring, improved functionalities and EMI measures can be achieved in electronics requiring high-speed multi-channel wirings in a cost effective manner. Specifically, the layered substrate according to the invention will be important for designing the next generation portable devices with mixed wireless systems, or for designing CPU boards operated at higher clock rates.

DETAILED DESCRIPTION OF THE PREFERRRED EMBODIMENTS

The present invention provides optical waveguide devices, layered substrates and electronics devices having configurations as described above. The above-described basic configuration includes the following embodiments.

Figure 1:
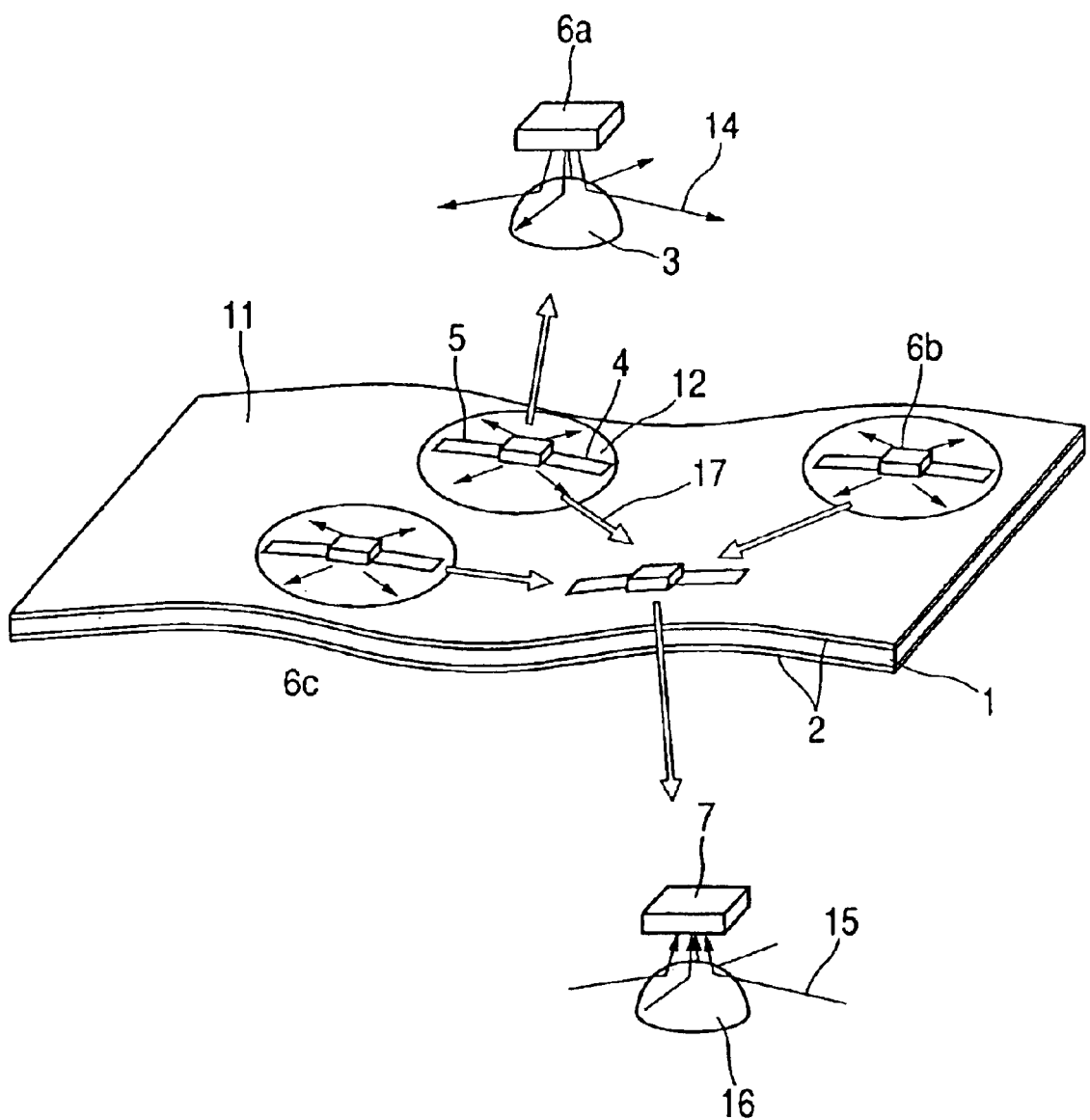
FIG. 1 is a perspective view of an optical waveguide device of Example 1 according to the invention.
Figure 4:
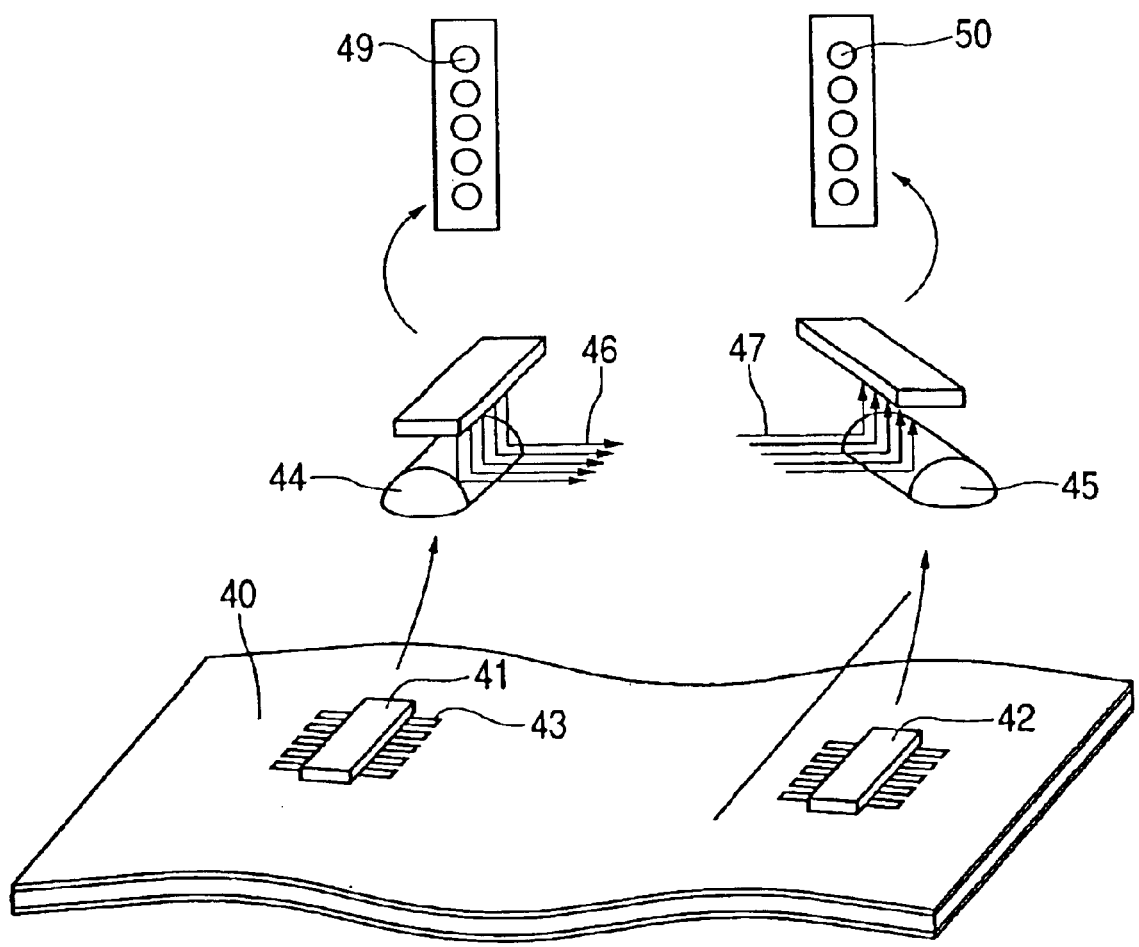
FIG. 4 is a perspective view illustrating an optical waveguide device of Example 2 according to the invention.
Figure 5:
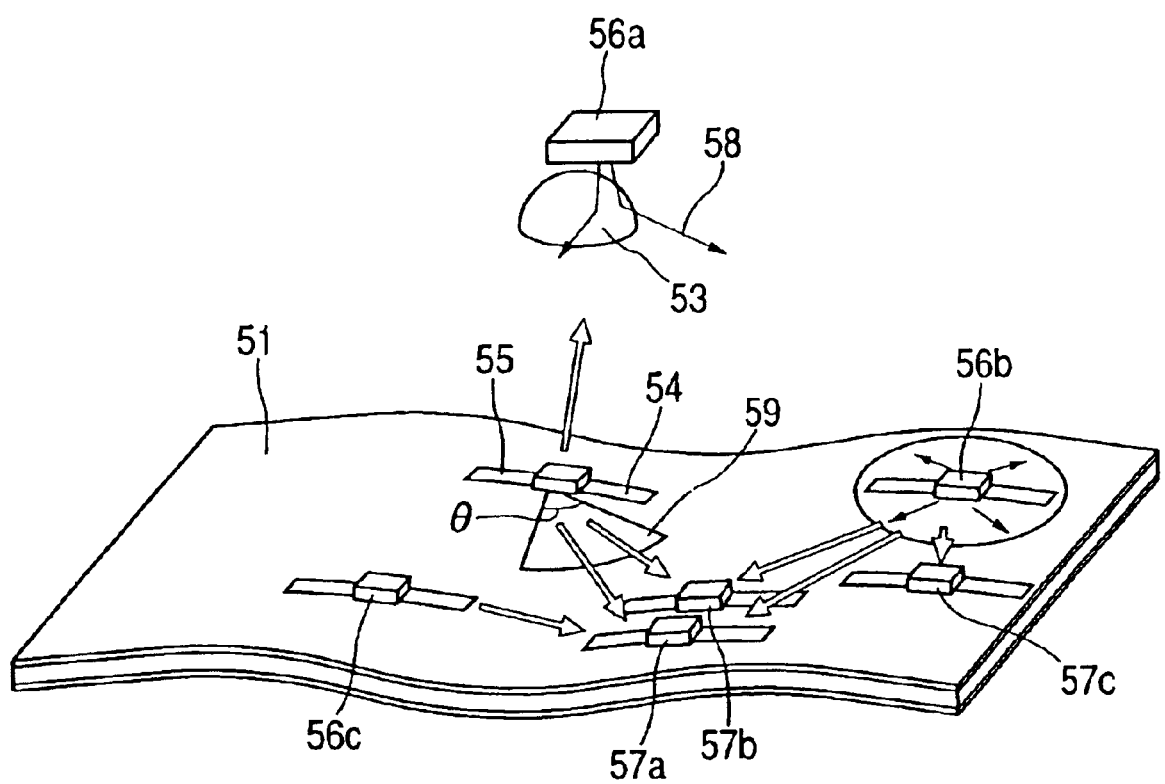
FIG. 5 is a perspective view illustrating an optical waveguide device of Example 3 according to the invention.

According to one embodiment, the optical waveguide layer may further be provided with a light-emitting element and a second light direction-altering means for altering the direction of light incident at a certain angle to the in-plane direction of the optical waveguide layer (for example, perpendicular to the plane of the optical waveguide layer), and the second light direction-altering means is positioned in such a manner that the direction of the light emitted from the light-emitting element can be altered by the second light direction-altering means to enter the optical waveguide layer. In the present invention, an optical waveguide layer means a layer that can transmit light signals in the plane, including those in a sheet form. The light direction-altering means for light-emitting element may couple light optically to the optical waveguide in all directions in the plane of the waveguide layer as shown in FIG. 1, it may couple light to the optical waveguide as a directional beam as shown in FIG. 4, it may narrow the emission angle of optical signals, for example, to 90 degrees, in order to transmit light signals only to a certain area of the optical waveguide as shown in FIG. 5. By narrowing the emission angle of the optical signals, long transmission distance and/or high transmission rate is obtained in comparison with two-dimensional all-direction coupling. Further, different types of light direction-altering means may be provided for light-emitting elements, so that the above three transmission systems coexist in one light waveguide device: in this case, a plurality of signals can be multiplexed in the same optical waveguide sheet to be detected by a light-receiving element provided with light-receiving portions arranged in a proper array.

Figure 2:
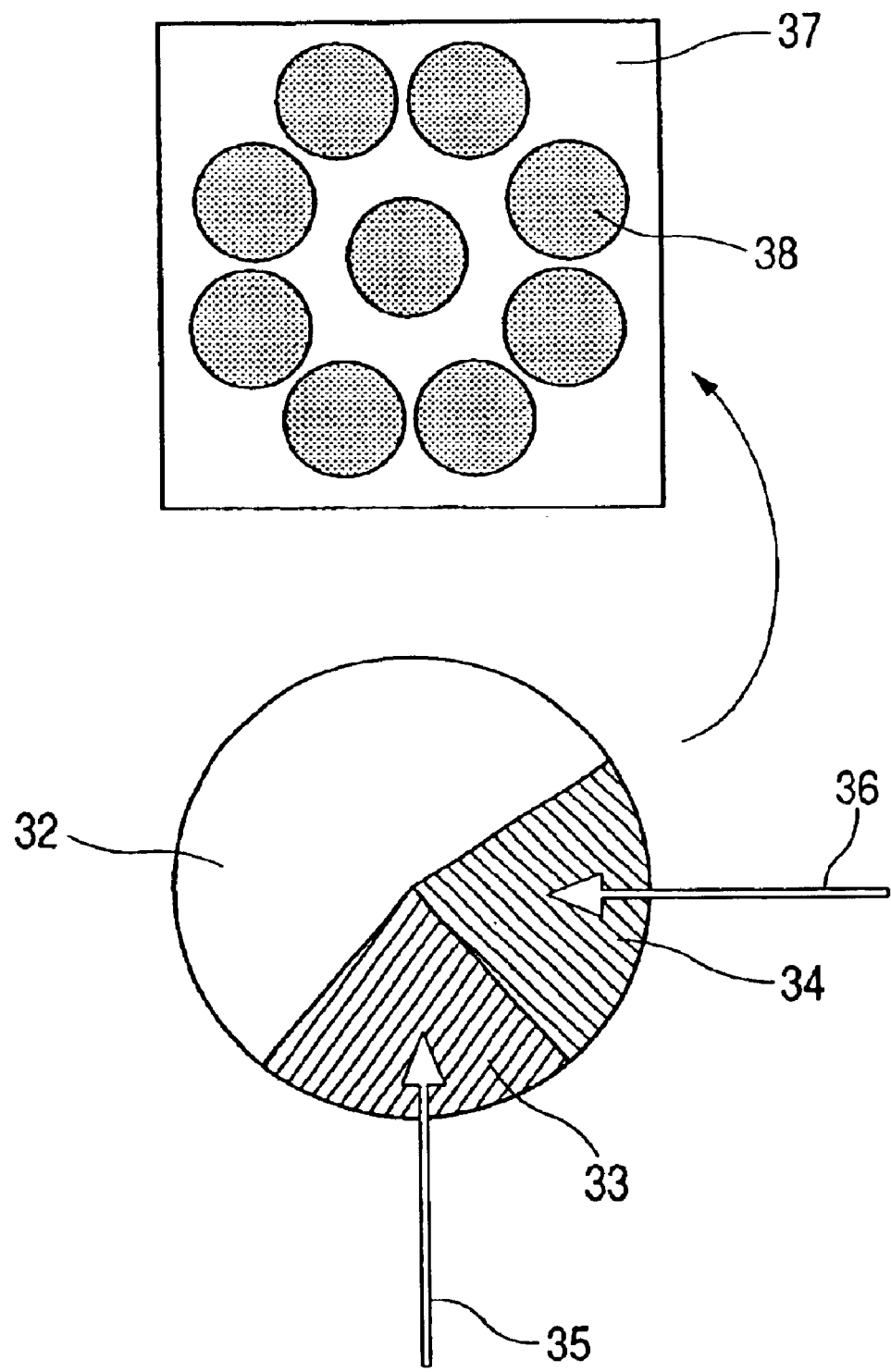
FIG. 2 is a plan view illustrating a light-receiving portion and light direction-altering structure of an optical waveguide device of Example 1 according to the invention.

For example, the light-receiving element may have at least plural light-receiving portions arranged in a circle, and a light direction-altering means for it can receive light transmitted from every direction in the optical waveguide layer, so that the intensity of light received by respective light-receiving portions varies depending on the position of the transmitting source of the transmitted light, which enables signal reception with discrimination of the source. In one specific embodiment, at the transmitting end a light signal is propagated in all directions in the waveguide layer as shown in FIG. 1, and at the receiving end, the signal is received and transmitted by a hemispheric, conic or pyramid shaped light direction-altering means to a light receiving element provided with light receiving portions mounted on its surface in a circle around the center corresponding to the top point of the altering means as shown in FIG. 2. This allows positional identification of the transmitting source by the receiving element, so that one receiving element can receive a multiplexed signal, discriminating signals from plural transmitting sources. The number of channels may, of course, be increased by multiplying the optical waveguide layers with a mixed positional multiplex.

Alternatively, the light-receiving element has light-receiving portions arranged linearly, and the light direction-altering means for it can receive light transmitted from a specified region of the optical waveguide layer. Since the intensity of light received by respective light-receiving portions varies depending on the position of the transmitting source of the transmitted light, this configuration allows signal reception with discrimination of the transmitting source.

Alternatively, incident light from the light-emitting element propagates in every direction in the optical waveguide layer, and the light-receiving element provided with light receiving portions arranged in a circle detects the signal with positional discrimination of the light-emitting element, so that one light-receiving element can receive multiple optical signals from multiple emitting elements at a time in the same optical waveguide layer. Further, it may be arranged in such a manner that incident light from the light-emitting element is propagated at a specific emission angle in the optical waveguide layer, and the light-receiving element provided with light-receiving portions arranged in a circle detects light signals with positional discrimination of the transmitting sources. Thus, one light-receiving element can receive multiple optical signals from multiple emitting elements at a time in the same optical waveguide layer.

It is also possible to configure an optical waveguide device in such a manner that light emitted from a light-emitting element is propagated as parallel beams in the optical waveguide layer in a certain direction and is detected by a light-receiving element having linearly arranged light-receiving portions with positional discrimination of the emitting element, whereby one light-receiving element can receive multiple optical signals from multiple emitting elements at a time in the same optical waveguide layer. Specifically, plural directional beams emitted from a transmitting element are optically coupled to an optical waveguide and a light-receiving element provided with plural light-receiving portions in a linear arrangement where respective light-receiving portions are aligned to receive beams redirected by a light direction-altering means such as a long mirror inclined at an angle of 45 degree. Thereby multiplexed signals can be received by one light-receiving element composed of linearly arranged light-receiving regions.

It is also possible to configure an optical waveguide device containing plural light-emitting elements that emit light in various propagation forms as described above, and plural light-receiving elements that receive light in a different manner as described above in one waveguide layer in the mixed form, whereby plural optical signals are simultaneously exchanged in one waveguide layer (see the arrangement shown in FIG. 5).

The optical waveguide device of the present invention may further include an active relay means (see the reference numeral 235 in FIG. 7) that converts an optical signal to an electric signal and then to an optical signal again: light directed by a light direction-altering means to propagate in the optical waveguide layer is subjected to an optical/electric (OE) conversion to reshape the signal, then to an electric/optical (EO) conversion to reproduce an optical signal, which is further redirected by a light direction-altering means to propagate in the optical waveguide layer in a predetermined propagation manner.

Particular examples will now be described with reference to drawings in order to clarify embodiments according to the present invention.

EXAMPLE 1

FIG. 1 is a perspective view of an entire optical waveguide device according to this Example of the invention. An optical waveguide layer (optical waveguide sheet) 11 of good processability is produced using two kinds of transparent polymer materials different in refraction index in combination to provide a flat flexible sheet that can easily be bent, where a core layer 1 (a region of relatively high refractive index) and upper and lower clad layers 2 (regions of a relatively low refractive index) are formed with a total thickness of several hundred microns. In this Example, polycarbonate Z (PCZ) having a refractive index of 1.59 is used for the 100 $\mu$m thick core layer 1, and ARTON with a refractive index of 1.53 is used for the 100 $\mu$m thick clad layers 2. The materials and thickness are not limited to these discussed above.

Surface light-emitting elements 6a–6c such as LED and surface-emitting laser are mounted as a light source and connected to electrodes 4, 5 formed on the optical waveguide layer 11 to drive the elements. The surface-emitting laser may be VCSEL, which is prepared, for example, as follows: a GaAs/AlGaAs MQW active layer, a spacer layer forming a single wavelength resonator, and AlAs/AlGaAs DBR mirrors (located on either sides of the active layer) are formed on a GaAs substrate using a crystal growth method such as MOCVD.

Under the surface-emitting element 6, a light direction-altering structure 3 being substantially hemispheric is embedded in the core layer 1 of the optical waveguide layer 11 to direct light from the light-emitting element 6 into the optical waveguide layer 11 as shown by the reference numeral 14. In this example, the center of the light-emission part of the light-emitting element 6 is aligned to come just above the top point of the substantially hemispheric structure 3, so that the transmitted light can be propagated in all directions, i.e., over 360 degrees, as shown by the reference numeral 12, in the entire layer 11 constituting a planer slab waveguide.

A part of the light coupled to the optical waveguide layer 11 propagating as a beam of reference numeral 17 in FIG. 1 is reflected upward from the layer 11 by a light direction-altering structure 16 located under a light-receiving element 7, which is similarly surface mounted, so that the optical signal is received by the light-receiving element 7. If the light direction-altering structure 16 is substantially hemispheric, it can receive from all directions light propagating in the optical waveguide layer 11. Thus, such light as shown by reference numeral 15 can be directed upward by the light direction-altering means 16 and be received by the light-receiving element 7. As the light-receiving element 7, a Si PIN photodiode (PD) and the like can be used.

In FIG. 1, a part of the mounted optical elements 6, 7 somewhat protrudes above the surface of the optical waveguide layer 11. They can, however, be fully embedded depending on the thickness of the optical element and/or the depth of the guide hole for the optical element.

In this Example, when the light direction-altering structure 16 in the signal receiving end has a hemispheric shape, the surface region of the light direction-altering structure 16 that reflects light from a transmitting source varies depending on the direction of the transmitting source. Thus, a light beam in a certain direction is received only by a light-receiving portion of the light-receiving element 7 located just above the reflecting surface region of structure 6. As can be seen in FIG. 2, which shows a plan view of a hemispheric structure 32, the reflected light intensity of an incident light coming from a direction 35 is particularly strong from a region 33 of the hemispheric structure 32, and that of the light from a direction 36 is particularly strong in a region 34. Accordingly, if the surface of the light-receiving element 37 is mounted with a plurality of light-receiving portions 38 arranged in a circular form around another light-receiving portion 38 arranged to be located just above the top point of the hemispheric structure 32 as shown in FIG. 2, and each of them can independently detect signals, it is possible to identify the position of the transmitting source based on the received light pattern by the light-receiving portions 38. For example, the relationship between each transmitting source and the light intensity pattern may be stored in a memory portion of the circuit, and retrieved to process signals according to a program in the processing portion. Therefore, even if there are multiple transmitting sources 6 as shown in FIG. 1, plural signals can be multiplexed in the same core 1 in the planar slab optical waveguide layer 11 not having linear waveguides. Although a hemispheric shape is used as a structure for altering light in all directions in this example, a conic or pyramid shape may also be used. The number and/or pattern of the light-receiving portions are not limited to those shown in FIG. 2.

Figure 3A:
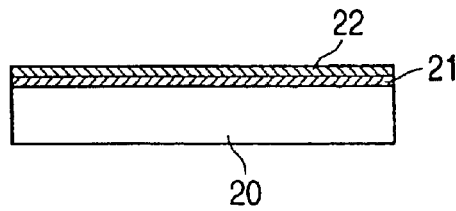
FIGS. 3A, 3B, 3C, 3D, 3E, 3F and 3G are sectional views illustrating processes of fabricating an optical waveguide device of Example 1 according to the invention.
Figure 3B:
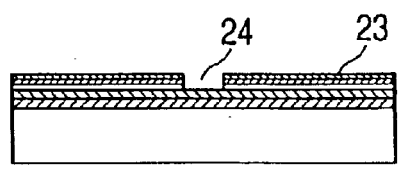
Figure 3C:
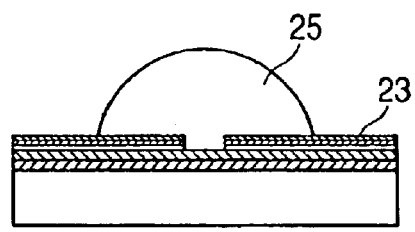

Next, an exemplary fabricating process of an optical waveguide device of this example is described with reference to FIGS. 3A, 3B, 3C, 3D, 3E, 3F and 3G. In this example, a light direction-altering structure embedded within an optical waveguide layer is made by metal plating. In FIG. 3A, Cr/Au (21 and 22 respectively) is deposited on a glass substrate 20 as an entire surface electrode for plating. The substrate is not limited to glass and may be Si, ceramic and resin, etc. In FIG. 3B, photoresist 23 is patterned by photolithography, and a window 24 for plating is formed at any desired location where a light direction-altering structure is to be formed. In this example, the size of the window 24 is 5–10 $\mu$m in diameter. In FIG. 3C, thickening the material beyond the photoresist 23 by plating results in a hemispheric shape as shown by the reference numeral 25. In this example, Ni electrolytic plating was used to create a hemispheric structure 25 having a thickness of 80 $\mu$m that is slightly less than 100 $\mu$m of the core layer thickness of an optical waveguide sheet: this leads to a diameter of 160 $\mu$m. Any size may be obtained by adjusting plating time, etc. to optimize the result depending on a sheet thickness, a type of light source and/or light-receiving element.

Figure 3D:
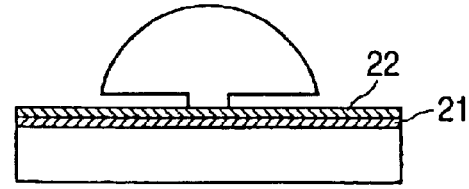

The plating material may be Cu, Cr, Al, Au and other metals or compounds, and heterogeneous materials may be multilayered. The electroless plating may be used. In FIG. 3D, removing the photoresist 23 reveals a structure that has a hemispheric shape 25 of 160 $\mu$m in diameter having a stem (base) of about 10 $\mu$m in diameter. Although any desired number and pattern of hemispheric structures 25 may be formed by patterning the photoresist 23, if necessary, certain hemispheric structures 25 may be removed by flipping off or by adhering to an adhesive tape. This allows to form various arrangements of hemispheric structures even if the same photoresist patterning mask was used.

Figure 3E:
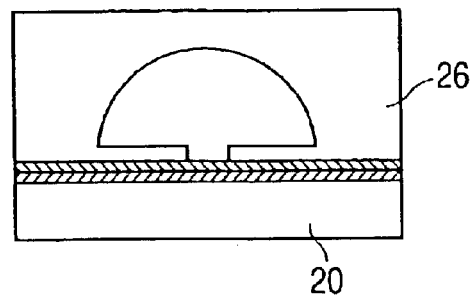
Figure 3F:
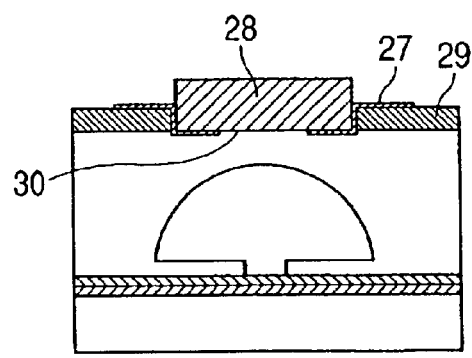

In FIG. 3E, a polymer material as a core layer 26 is formed to embed the hemispheric structure 25 by dipping, casting, or a dispensing method and the like. In FIG. 3F, a clad layer 29 having a smaller refractive index than the core layer 26 is then formed on the surface, and a hole 30 is formed for an electrode wiring 27 and for mounting an element. In this example, a sheet of ARTON (trade name), having holes formed by using an excimer laser etc. at the sites where the elements are to be mounted, is attached to the surface of the core layer 26. Alternatively, photosensitive resin such as SU-8 (trade name), BCB, etc. may be used and directly patterned to create holes. Since SU-8 has a high refractive index, it should be applied only adjacent to the element mounting areas. Alternatively, the clad layer 29 can be omitted, and hole 30 can be processed directly in the core using laser machining to control the depth for mounting an element.

Alternatively, the fitting hole 30 may be omitted, and the optical element may be directly mounted by a flip-chip bonding alignment.

An electrode or electric wiring 27 is metal wiring such as aluminum, copper, and the like. To create it, vacuum evaporation and lithography technologies may be used to form a wiring pattern with Al, Cu, Ag, Au etc. Alternatively, a conductive paste of Cu, Ag, Au etc. may be applied on the waveguide layer using screen printing to form a circuit conductor pattern, and then the paste may be baked or hardened to form a circuit conductor.

Alternatively, a metal foil such as an electrolytic copper foil may be layered, and an etching resist of a desired pattern may be used to chemically etch the metal foil for forming a circuit conductor pattern. Additionally, conductive polymers that match the polymer waveguide in terms of the thermal expansion coefficient and elasticity coefficient may be used for the wirings.

Figure 3G:
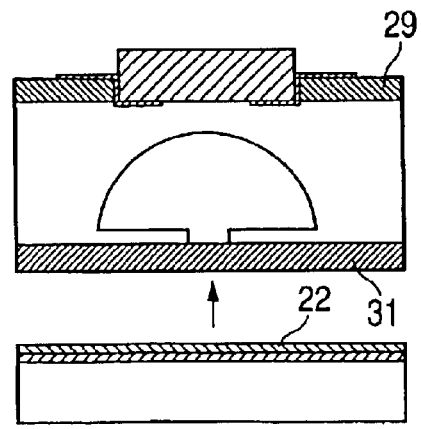

The light-emitting or light-receiving element 28 is mounted, so as to contact an electrode formed on the optical waveguide layer using flip-chip bonding. Thus, an Ag paste or cream solder may be printed or applied by a dispenser, and then an optical element may be inserted into a guide hole 30 and adhered by heating at about 120° C. In FIG. 3G, when the optical waveguide layer is removed from the substrate by an ultrasonic treatment, etc., the embedded hemispheric structures are lifted and included within the optical waveguide layer. Additionally, a lower clad layer 31 may be formed as required. Although not shown, when position discrimination is required, an end of the optical waveguide layer is preferably roughly polished or coated with an optical absorber, because a reflection from the end causes deterioration of the S/N ratio.

The position and number of the light-emitting and light-receiving elements in FIG. 1 are provided only for the purpose of clarity of the example, and they are intended to be designed as a whole based on wirings of an electric circuit or pins of an electronic chip that are to be connected in practice. An optical waveguide device according to the present invention may be used to design wirings required for high-speed transmission or EMC measures that provide more improved functionalities and lower costs for development than electrical wirings.

EXAMPLE 2

The device in Example 1 may suffer a large attenuation, because light is propagated in all directions in two dimensions (in a plane of a layer), and the transmission distance may be limited to several centimeters in a gigabit order transmission. Optical power received per 1 mm arc when light propagates for R (mm) is attenuated in an amount expressed by $10*\log(\frac{1}{2}\pi R)+R*\alpha(dB)$, where $\alpha$ is a propagation loss in dB/mm. Thus, when the light is detected by a light detector having a diameter of 1 mm, the loss of 20 mm propagation is 21 dB even if a is ignored, and 31 dB if the coupling loss of approximately 10 dB is added. Thus, when the application is not a one-to-many transmission such as a clock distribution, directional propagation may be advantageous in terms of power consumption and/or costs.

In this Example, an arrayed light source 41 having an electrical wiring 43 that corresponds to each bit is used as a parallel beam source, as shown in FIG. 4, and light from each light-emitting point 49 is independently propagated as a beam 46 in the same optical waveguide layer (sheet) 40. The emission angle of the beam may be controlled using a microlens, etc. mounted on each surface of the light-emitting point to separately transmit the light as the beam 46 using a planar slab waveguide of several tens centimeters without fabricating a linear waveguide. In this Example, a light direction-altering structure 44 in the shape of a half cylinder is embedded in an optical waveguide sheet 40 by a plating technique similar to that in Example 1, as shown in FIG. 4, to optically couple each beam and propagate it in the optical waveguide layer 40. The beams are then reflected by a light direction-altering structure 45 also in the shape of a half cylinder, and each beam 47 separately propagated is detected and discriminated in its position by a receiving portion 42 having one-dimensionally arrayed light-receiving regions 50. Instead of a half cylinder, the light direction-altering structure may be a triangular prism laid along, or the optical waveguide layer 40 with its edge cut at 45 degrees.

The one-dimensionally arrayed transmitting member 41 and receiving member 42 are surface mounted on the optical waveguide layer 40 and are in an electrical contact with an electrical wiring 43 to independently drive each element. They are designed for wirings of an electric circuit or pins of an electronic chip.

In this Example, attenuation of light is reduced to approximately 0.04 dB/mm of a propagation loss in the optical waveguide layer 40 and a coupling loss of 10 dB, and the light attenuation for 300 mm propagation is 22 dB. Thus, this is applicable to the end to end wiring of a typical electric circuit board. A cross-talk may occur between bits depending on a space between beams. However, since this example uses a 500 $\mu$m pitch and a light-receiving region of 100 $\mu$m in diameter, the cross-talk between channels can be reduced to 20 dB or less and the error rate from 10 to 9 or less when the light source power is 1 mW and propagation is as short as about 100 mm. If the cross-talk is a problem, differential output between adjacent light-receiving regions 50 may be taken and electrically processed to avoid the cross-talk problem.

EXAMPLE 3

This example combines planar (in a plane of a layer) transmission of Example 1, beam transmission of Example 2, and an optical transmission at a certain directional angle, as shown in FIG. 5.

When a light-emitting element 56*a* having electrical wirings 54, 55 is mounted out of alignment with the top point of a hemisphere light direction-altering structure 53, beam 58 propagates at a certain angle θ as shown by the reference numeral 59, rather than in all directions. This enables optical transmission from one transmitting source to multiple receiving portions, but with less power loss and a longer transmission distance in comparison with a 360 degree (all direction) transmission. In FIG. 5, a transmitting source 56*b* optically transmits signals two-dimensionally in all direction as in Example 1, and a light source 56*c* propagates light as a beam in a certain direction as in Example 2. Thus, when optical detectors 57*a*, 57*b* and 57*c* are provided with circularly arranged light-receiving portions as in FIG. 2, 57*a* detects and discriminates light from light sources 56*a*, 56*b* and 56*c*, 57*b* detects and discriminated light from light sources 56*a* and 56*b*, and 57*c* detects and discriminates light from a light source 56*b*. Thus, free wiring designs different from electrical wirings is possible.

The planar transmission may provide a clock distribution, the transmission in a certain emission angle may provide a one-to-many bus wiring, and the directional beam transmission may provide a one-to-one wiring: a single optical waveguide layer 51 can combine several wiring schemes for multiplexing.

EXAMPLE 4

Figure 6:
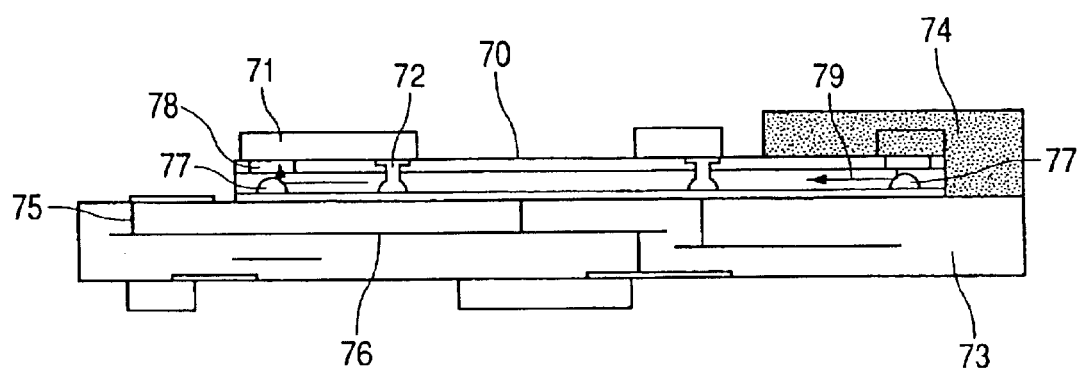
FIG. 6 is a sectional view of a combined electric/optical substrate that combines an optical waveguide device of Example 4 according to the invention with an electric circuit.

In this Example, an optical waveguide device as described above is applied to a small, portable piece of equipment. To illustrate the Example, FIG. 6 shows a sectional view of a layered substrate that integrates a multilayer buildup substrate and an optical waveguide device. An optical waveguide layer (sheet) in which a light direction-altering structure 77 and/or via wirings 72 are formed as described above is applied to an electric circuit board 73 in which an electrical wiring 76 and/or via wirings 75 are formed. An electrode for driving an optical element 78 and/or IC 71 in contact with through-hole electrodes 72 from the substrate 73 are mounted on the surface of the layered substrate 70.

In FIG. 6, the reference numeral 74 is an RF circuit portion for wireless communications that is covered with a shield cover to avoid electromagnetic interference. Traditionally, a signal wire drawn from an RF circuit portion may serve as an antenna depending on the length of the signal wire, causing a faulty operation of its own circuit due to a common mode noise radiation, or resulting in an extensive design time in order to satisfy the standards imposed by the Radio Law. In this example, an optical signal wiring as shown by the reference numeral 79 using a combined electric/optical substrate 70 according to the invention can significantly reduce unwanted radiation, because it does not form an antenna.

In the future wireless communication, a number of high-speed schemes using different frequencies, such as IEEE802.11a (5 GHz band, 54 Mbps), BLUETOOTH (2.4 GHz, 1 Mbps) and the fourth generation mobile phones (5 GHz band, 100 Mbps) are likely to coexist. This will require EMC design for a small mobile phone and wirings that can be changed in their architecture in situ. A combined electric/optical substrate integrated with an optical waveguide device such as the one according to the invention can increase design flexibility thereof and reduce costs.

In FIG. 6, although an optical waveguide layer (sheet) is applied onto an electric circuit board 73 and electronic chips 71, etc. are further mounted thereon, an optical waveguide layer (sheet) may, of course, be embedded within a multilayer buildup substrate.

EXAMPLE 5

Figure 7:
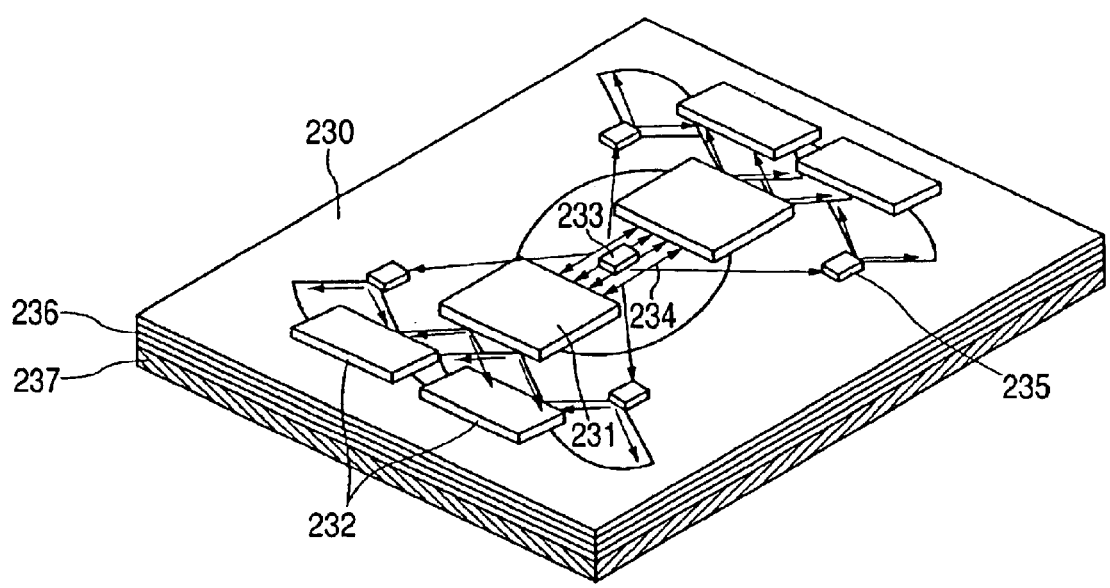
FIG. 7 is a perspective view of a combined electric/optical substrate with high-speed signal connections of Example 5 according to the invention.
Figure 8A:
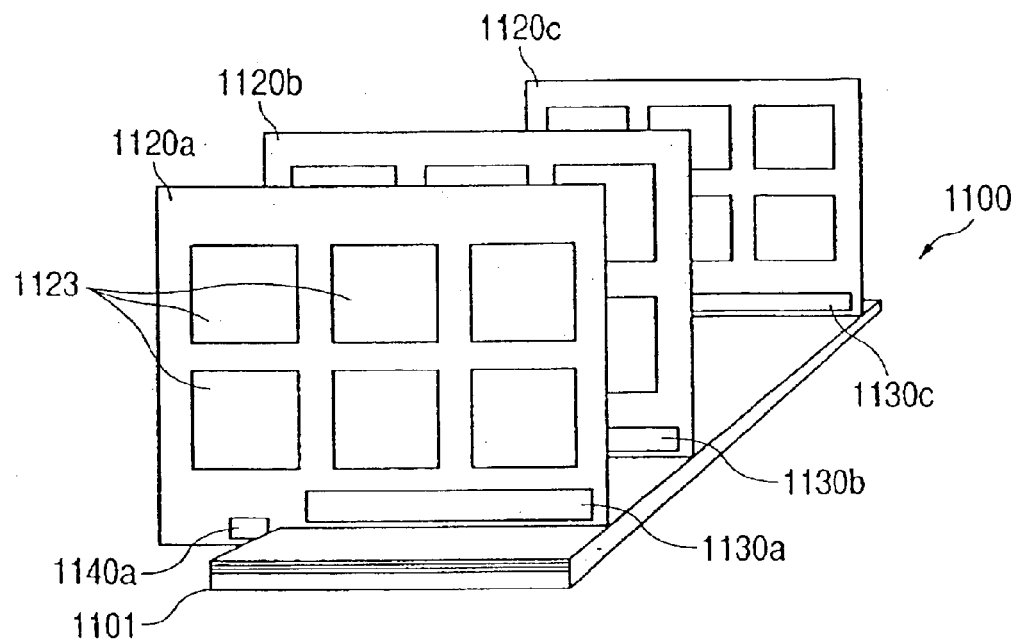
FIGS. 8A and 8B illustrate an example of a conventional optical waveguide device using a planar waveguide sheet.
Figure 8B:
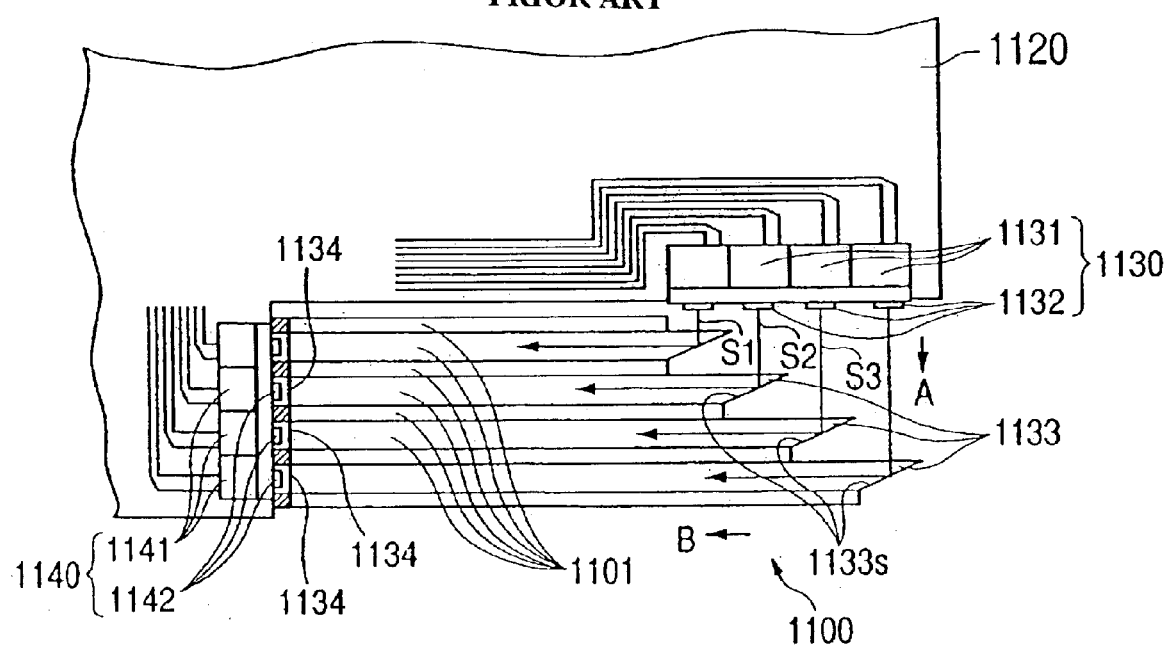

Above Examples describe exemplary optical waveguide layers of a single layer. A buildup combined electric/optical substrate with a multi-layered optical waveguide layer may allow a faster data transfer. FIG. 7 shows a board 230 combined with high-speed bus, etc. using such optical wirings. The board has a dual CPU (231) configuration, and accesses between CPUs 231 and between CPUs 231 and memory devices 232 are arranged using an optical waveguide device (using beams 234, etc.) according to the invention. Four layers of optical waveguide layer (sheet) 236 are stacked up as shown in FIG. 7, and the board 230 has a 4×4, or a 16 bit-configuration in the surface direction by multiplexing 4 bits using directional beams as described in Example 4. In this example, light-receiving/light-emitting elements are mounted, so as to provide a bi-directional transmission. Additionally, 64 bit-output of the CPU may be parallel-to-serial converted to obtain 16 bits and optically transmit signals at 10 Gbps per bit: this provides for a 160 Gbps (20 Gbite/sec) serial connection for one entire channel at 2.5 GHz operation per bit (64 bit equivalent).

An access to the memory 232 is a bus wiring capable of a one-to-many, 8 bit transmission in 4 layers, using a 90 degree emission angle of 2 bit as shown in Example 3. FIG. 7 shows a certain directional angle transmission from the CPU 231 to the memory 232, as is a transmission from the memory 232 to the CPU 231. A clock generator 233 using an Xtal integrated element simultaneously distributes clocks to two CPUs 231 through a planar transmission as in Example 1. The clocks may be repeated at relay points 235 (where the clocks are reproduced and transmitted using OE and EO conversion) according to the size of the board and distributed to required areas in the substrate using, for example, a 90 degree emission angle transmission, as appropriate.

I/O ports, which are not shown, are connected using conventional electrical wirings in the multilayer electric circuit board portion 237. Optical wirings, however, may also be applied for this purpose as described above.

With arrangements described above, high-speed connectivity is provided, while EMI noises are suppressed and a multi-CPU system may be constructed to directly connect a plurality of CPUs or peripheral devices together, which are remotely located, via a network. The width of a path, positions, amounts, wiring scheme and the like among elements are not limited to those in FIG. 7.

Current buildup substrates made up only of electrical wirings present challenges of how cross-talk noises caused by closely located wirings, signal degradation caused by a reflection due to an impedance mismatch, etc. and resulting electromagnetic radiation noises should be solved in a high-speed signal wirings. Additionally, a high-speed serial transmission is being explored as a bus for a next generation high-speed LSI connectivity, and RapidIO (Motorola, USA, etc.), Hyper Transport (AMD, USA, etc.), 3GIO (Intel, USA, etc.) and the like is being developed with a current target of 1 Gbyte/sec at 1 GHz in 8 bit. If 10 Gbyte/sec or more is required with the same specifications in a further generation technology, combined high-speed wirings with positional multiplexing using optical waveguide devices according to the present invention will be effective in terms of electromagnetic radiation noises, board design and power consumption.

As described above, a multiplexed optical wiring that facilitates the construction of unrestricted wiring architecture may be provided according to the invention in an optical waveguide device that may be utilized for high-speed wirings in an electric circuit board or electromagnetic noise measures without complex waveguide structures at a low cost. The apparatus may be used for a part of wirings on an electrical board on which LSIs, etc. are mounted to provide a multilayer substrate, so that EMI measures can be implemented without major design modifications at a low cost. Additionally, high-speed bus wirings that provide additional design flexibility of a board are provided by a multilayer substrate according to the invention in the construction of, for example, a high-speed multi-CPU system.

What is claimed is:

1. An optical waveguide device comprising:
    an optical waveguide layer; and
    a light-receiving element having a plurality of light-receiving portions for receiving light propagated through the optical waveguide layer,
    wherein the optical waveguide layer propagates light emitted from a plurality of light-emitting sources and has a light direction-altering portion, which alters the direction of light propagated in the optical waveguide layer and directs the light to the light-receiving element,
    wherein each of the light-receiving portions receives light from the light direction-altering portion, and
    wherein the light direction-altering portion has plural light-reflecting surface portions, each of which reflects light propagated from a corresponding light-emitting source.

2. The optical waveguide device according to claim 1, wherein the optical waveguide layer is further provided with a light-emitting element, and the light direction-altering portion receives light emitted from the light-emitting element at an angle to an in-plane direction of the optical waveguide layer, wherein the light direction-altering portion and the light-emitting element are in such a relative position that light emitted from the light-emitting element is directed into the optical waveguide layer.

3. The optical waveguide device according to claim 1 or 2, wherein the light-receiving element comprises the plurality of light-receiving portions arranged in a circular form, and the light direction-altering portion allows the light-receiving element to receive the light propagated from all directions in the optical waveguide layer, and the light-receiving element discriminates a transmitting source of the received light based on a light intensity distribution that varies depending on the position of the transmitting source of light.

4. The optical waveguide device according to claim 3, wherein the light direction-altering portion is in a form of a hemispheric or conic structure embedded in the optical waveguide layer.

5. The optical waveguide device according to claim 1 or 2, wherein the light-receiving element includes at least a plurality of light-receiving portions that are linearly arranged, and the light direction-altering portion allows the light-receiving element to receive light propagated from a predetermined region in the optical waveguide layer, and the light-receiving element discriminates the transmitting source of the received light based on a light intensity distribution that varies depending on the position of the transmitting source of light.

6. The optical waveguide device according to claim 5, wherein the light direction-altering portion is in a form of a half cylindrical or triangular structure laid sideways and embedded in the optical waveguide layer.

7. The optical waveguide device according to claim 3, wherein the device is configured to propagate incident light from the light-emitting element in every direction in the optical waveguide layer, and to detect the optical signal discriminating the position of the light-emitting element by using the light-receiving element, so as to simultaneously receive optical signals from a plurality of light-emitting elements in the same optical waveguide layer with one single light-receiving element.

8. The optical waveguide device according to claim 3, wherein the device is configured to propagate incident light from the light-emitting element at a specific emission angle in the optical waveguide layer, and to detect the optical signal by the light-receiving element discriminating the position of the light-emitting element so as to simultaneously receive optical signals from a plurality of light-emitting elements in the same optical waveguide layer with one single light-receiving element.

9. The optical waveguide device according to claim 5, wherein the device is configured to propagate incident light from light-emitting elements as parallel beams in a specific direction in the optical waveguide layer, and to detect the optical signals by the light-receiving element discriminating the positions of the light-emitting elements so as to simultaneously receive optical signals from the light-emitting elements in the same optical waveguide layer with the light-receiving element.

10. The optical waveguide device according to claim 1, wherein an electric wiring is provided on the surface of the optical waveguide layer to drive the optical element.

11. The optical waveguide device according to claim 1, wherein the device further comprises a relay means that receives propagated light, performs optical/electric (OE) conversion, performs electric/optical (EO) conversion to reproduce optical signals, and causes the light to propagate in the optical waveguide layer in a predetermined mode of propagation.

12. A layered substrate comprising an electric circuit board and an optical waveguide device according to claim 1 provided thereon with electric connections to operate an electronic equipment where interconnection of all or a part of the signals from the electric circuit is carried out by exchange of optical signals through the optical waveguide device.

13. The layered substrate according to claim 12, wherein the optical waveguide device is embedded within an electric circuit multilayer substrate.

14. The layered substrate according to claim 12, wherein the optical waveguide device is multilayered and connected to an electric circuit board and an electronic chip.

15. An electronic equipment having an optical wiring using a layered substrate according to claim 12 and multi-bit wirings between a plurality of electronic chips for system operation.

* * * * *

UNITED STATES PATENT AND TRADEMARK OFFICE
CERTIFICATE OF CORRECTION

PATENT NO. : 6,928,205 B2
DATED : August 9, 2005
INVENTOR(S) : Toshihiko Ouchi

It is certified that error appears in the above-identified patent and that said Letters Patent is hereby corrected as shown below:

Title page,
Item [56], References Cited, OTHER PUBLICATIONS,
"High-temperatureApplications," should read -- High-temerature Applications, --.

Column 1,
Line 34, "is" should read -- are --.

Column 4,
Line 64, "degree." should read -- degrees. --.

Column 7,
Lines 29 and 40, close up right margin.
Lines 30 and 41, close up left margin.
Line 62, "SIN" should read -- S/N --.

Column 8,
Line 17, "a" should read -- α --.

Column 9,
Line 12, "direction" should read -- directions --.
Line 18, "discriminated" should read -- discriminates --.
Line 21, "is" should read -- are --.

Columnn 10,
Line 23, "Gbite/sec)" should read -- Gbyte/sec) --.

Signed and Sealed this

Twenty-first Day of February, 2006

JON W. DUDAS
*Director of the United States Patent and Trademark Office*